United States Patent
Corbeil et al.

(10) Patent No.: US 9,817,095 B2
(45) Date of Patent: Nov. 14, 2017

(54) METHOD FOR ELECTROMAGNETIC SHIELDING FOR A MAGNETIC RESONANCE SYSTEM AND CORRESPONDINGLY SHIELDED DEVICE

(71) Applicants: Siemens Aktiengesellschaft, Munich (DE); Siemens Medical Solutions USA, Inc., Malvern, PA (US)

(72) Inventors: James Corbeil, Knoxville, TN (US); Ralf Ladebeck, Erlangen (DE); Stefan Stocker, Grossenseebach (DE)

(73) Assignees: Siemens Aktiengesellschaft, Munich (DE); Siemens Medical Solutions USA, Inc., Malvern, PA (US)

( * ) Notice: Subject to any disclaimer, the term of this patent is extended or adjusted under 35 U.S.C. 154(b) by 1176 days.

(21) Appl. No.: 13/928,539

(22) Filed: Jun. 27, 2013

(65) Prior Publication Data
US 2014/0021953 A1   Jan. 23, 2014

(30) Foreign Application Priority Data
Jul. 18, 2012   (DE) ......................... 10 2012 212 574

(51) Int. Cl.
*G01R 33/421*   (2006.01)
*G01R 33/42*    (2006.01)
*G01R 33/48*    (2006.01)

(52) U.S. Cl.
CPC ......... *G01R 33/4215* (2013.01); *G01R 33/42* (2013.01); *G01R 33/481* (2013.01)

(58) Field of Classification Search
CPC ... G01R 33/42; G01R 33/481; G01R 33/4215
See application file for complete search history.

(56) References Cited

U.S. PATENT DOCUMENTS 4,642,569 A * 2/1987 Hayes ............... G01R 33/42
                                                     324/300
5,367,261 A * 11/1994 Frederick .......... G01R 33/422
                                                     324/318

(Continued)

FOREIGN PATENT DOCUMENTS

CN   1087757 A   6/1994
CN   1663076 A   8/2005

(Continued)

OTHER PUBLICATIONS

Chinese Office Action dated Dec. 25, 2015.

*Primary Examiner* — Dixomara Vargas
(74) *Attorney, Agent, or Firm* — Harness, Dickey & Pierce P.L.C.

(57) ABSTRACT

In one embodiment, an electromagnetic shielding of a device is disclosed for a magnetic resonance system. The device is shielded via a conductive layer which surrounds an inner part of the device in such a manner that an electrical current path completely around the inner part can be formed in the layer. The layer is arranged between a housing of the device, surrounding the inner part, and the inner part. In another embodiment, an electromagnetic shielding of a device is disclosed for a magnetic resonance system, wherein the device is shielded via a conductive layer which surrounds the device in such a manner that an electrical current path completely around the device is formed. In this situation, the device having the layer is mounted by way of projections on the magnetic resonance system. Each projection has a contact surface with the layer, at which the respective projection contacts the layer.

19 Claims, 3 Drawing Sheets

(56) References Cited

U.S. PATENT DOCUMENTS

| | | | | |
|---|---|---|---|---|
| 5,396,173 | A * | 3/1995 | Sakakura | H01G 2/22 324/318 |
| 5,760,584 | A * | 6/1998 | Frederick | G01R 33/422 324/318 |
| 5,886,596 | A * | 3/1999 | Vaughan, Jr. | G01R 33/422 324/318 |
| 5,986,531 | A * | 11/1999 | Carrozzi | G01R 33/422 324/318 |
| 6,144,204 | A * | 11/2000 | Sementchenko | G01R 33/385 324/318 |
| 6,232,779 | B1 * | 5/2001 | Tropp | G01R 33/34046 324/318 |
| 6,535,084 | B1 * | 3/2003 | Tropp | H01P 7/00 324/318 |
| 7,015,695 | B2 * | 3/2006 | Tropp | G01R 33/34046 324/309 |
| 7,053,617 | B2 * | 5/2006 | Havens | G01R 33/422 324/318 |
| 7,141,974 | B2 * | 11/2006 | Edelstein | G01R 33/4215 324/318 |
| 7,145,339 | B2 * | 12/2006 | Saylor | G01R 33/422 324/318 |
| 7,375,526 | B2 * | 5/2008 | Edelstein | G01R 33/3854 324/307 |
| 7,488,949 | B2 | 2/2009 | Ueno et al. | |
| 7,560,929 | B2 * | 7/2009 | Hsieh | G01R 33/3806 324/318 |
| 7,642,780 | B2 * | 1/2010 | Diehl | G01R 33/34046 324/318 |
| 7,714,574 | B2 * | 5/2010 | Ando | G01R 33/3806 324/309 |
| 7,755,357 | B2 * | 7/2010 | Holle | G01R 33/34046 324/318 |
| 7,772,503 | B2 * | 8/2010 | Ginanneschi | G01R 33/422 174/378 |
| 8,054,077 | B2 * | 11/2011 | Hsieh | G01R 33/3806 324/307 |
| 8,323,768 | B2 * | 12/2012 | Connelly | G01R 33/285 174/392 |
| 8,334,697 | B2 * | 12/2012 | Overweg | A61B 5/055 324/318 |
| 8,525,116 | B2 * | 9/2013 | Schulz | G01T 1/1603 250/363.02 |
| 8,552,726 | B2 * | 10/2013 | Sakakura | G01R 33/3854 324/318 |
| 8,554,294 | B2 * | 10/2013 | Kim | G01R 33/326 505/162 |
| 8,704,520 | B2 * | 4/2014 | Saha | G01R 33/34076 324/318 |
| 8,736,266 | B2 * | 5/2014 | Sakakura | G01R 33/3856 324/318 |
| 8,797,131 | B2 * | 8/2014 | Jiang | G01R 33/3804 335/216 |
| 8,874,193 | B2 * | 10/2014 | Popescu | A61B 6/037 600/407 |
| 9,040,828 | B2 * | 5/2015 | Person | C08K 5/3492 174/120 SR |
| 9,098,672 | B2 * | 8/2015 | Diehl | G01R 33/422 |
| 2005/0233642 | A1 | 10/2005 | Gerlich et al. | |
| 2006/0027913 | A1 | 2/2006 | Lungwitz | |
| 2006/0065848 | A1 | 3/2006 | Ueno et al. | |
| 2007/0026733 | A1 | 2/2007 | Greim et al. | |
| 2008/0068017 | A1 | 3/2008 | Eberler et al. | |
| 2010/0006782 | A1 | 1/2010 | Ladebeck | |
| 2013/0229181 | A1 * | 9/2013 | Biber | G01R 33/422 324/318 |

FOREIGN PATENT DOCUMENTS

| | | |
|---|---|---|
| CN | 1706233 A | 12/2005 |
| CN | 1904630 A | 1/2007 |
| CN | 101120876 A | 2/2008 |
| DE | 102004027814 A1 | 9/2005 |
| DE | 102005034914 A1 | 2/2007 |
| DE | 102008032480 A1 | 1/2010 |
| EP | 1642530 A1 | 4/2006 |
| WO | WO 9410723 A1 | 5/1994 |

* cited by examiner

METHOD FOR ELECTROMAGNETIC SHIELDING FOR A MAGNETIC RESONANCE SYSTEM AND CORRESPONDINGLY SHIELDED DEVICE

PRIORITY STATEMENT

The present application hereby claims priority under 35 U.S.C. §119 to German patent application number DE 102012212574.4 filed Jul. 18, 2012, the entire contents of which are hereby incorporated herein by reference.

FIELD

At least one embodiment of the present invention generally relates to a method for shielding a device within a magnetic resonance system against electromagnetic radiation, and/or a correspondingly designed device.

BACKGROUND

Electronic circuits within a magnetic resonance system must be shielded against the electromagnetic radiation generated by the magnetic resonance system in order to prevent a negative influence on the electronic circuit and conversely a negative influence by the electronic circuit on the magnetic field generated by the magnetic resonance system. To this end the electronic circuit is shielded according to the prior art by means of a thin metal layer (usually a copper layer).

In this situation, according to the prior art the problem occurs that cracks occur in the shield as a result of the vibrations which are generated in particular due to the switching of the magnetic field gradients by the magnetic resonance system. The cracks occur at the locations of the shield at which the shield is contacted by a mounting facility by which the electronic circuit is mounted in the magnetic resonance system.

SUMMARY

At least one embodiment of the present invention is directed to the electromagnetic shielding of a device for a magnetic resonance system.

A method for electromagnetic shielding of a device, a device and a magnetic resonance system are disclosed. The dependent claims define preferred and advantageous embodiments of the present invention.

A method for electromagnetic shielding of a device for a magnetic resonance system is provided within the scope of at least one embodiment of the present invention. In this situation the device is shielded with the aid of a conductive layer which surrounds an inner part of the device in such a manner that an electrical current path completely around the inner part can be formed in the layer. In other words a circular current can be generated by way of induction, which flows around the circumference of the inner part in the layer. In this situation the layer is arranged between a housing which surrounds the inner part (in particular completely) and the inner part.

A further method for electromagnetic shielding of a device for a magnetic resonance system is provided within the scope of at least one embodiment of the present invention. Also in the case of the further method the device is shielded with the aid of a conductive layer which surrounds the device in such a manner that an electrical current path completely around the device can be formed, as stated earlier. In this situation the device which is surrounded by the layer is mounted or fastened on the magnetic resonance system by way of a plurality of projections. Each of the projections has a contact surface with the layer, in which case the contact surface is defined by the fact that the respective projection contacts the layer at said contact surface. In other words, the device is fastened on the magnetic resonance system with the aid of one or more mounting facilities. In this situation the mounting facility or the mounting facilities has/have a plurality of projections, in which case the device to be mounted is contacted only by way of the projections (and not by other parts of the mounting facility).

A device for a magnetic resonance system is also provided within the scope of at least one embodiment of the present invention. In this situation, the device comprises an inner part, a housing, and a conductive layer. For electromagnetic shielding the conductive layer is arranged around the inner part in such a manner that an electrical current path completely around the inner part can be formed in the layer. The housing surrounds the layer such that the layer is arranged between the inner part and the housing.

A further device for a magnetic resonance system is also provided within the scope of at least one embodiment of the present invention. The further device comprises a conductive layer and projections. The conductive layer surrounds the remainder of the device (i.e. the device without the layer and the projections) in such a manner that an electrical current path completely around the remainder of the device can be formed. The device is mounted on the magnetic resonance system with the aid of the projections. In this situation, each projection contacts the conductive layer at a contact surface.

BRIEF DESCRIPTION OF THE DRAWINGS

The present invention will be described in detail in the following on the basis of preferred embodiments according to the invention with reference to the figures.

DETAILED DESCRIPTION OF THE EXAMPLE EMBODIMENTS

Figure 1:
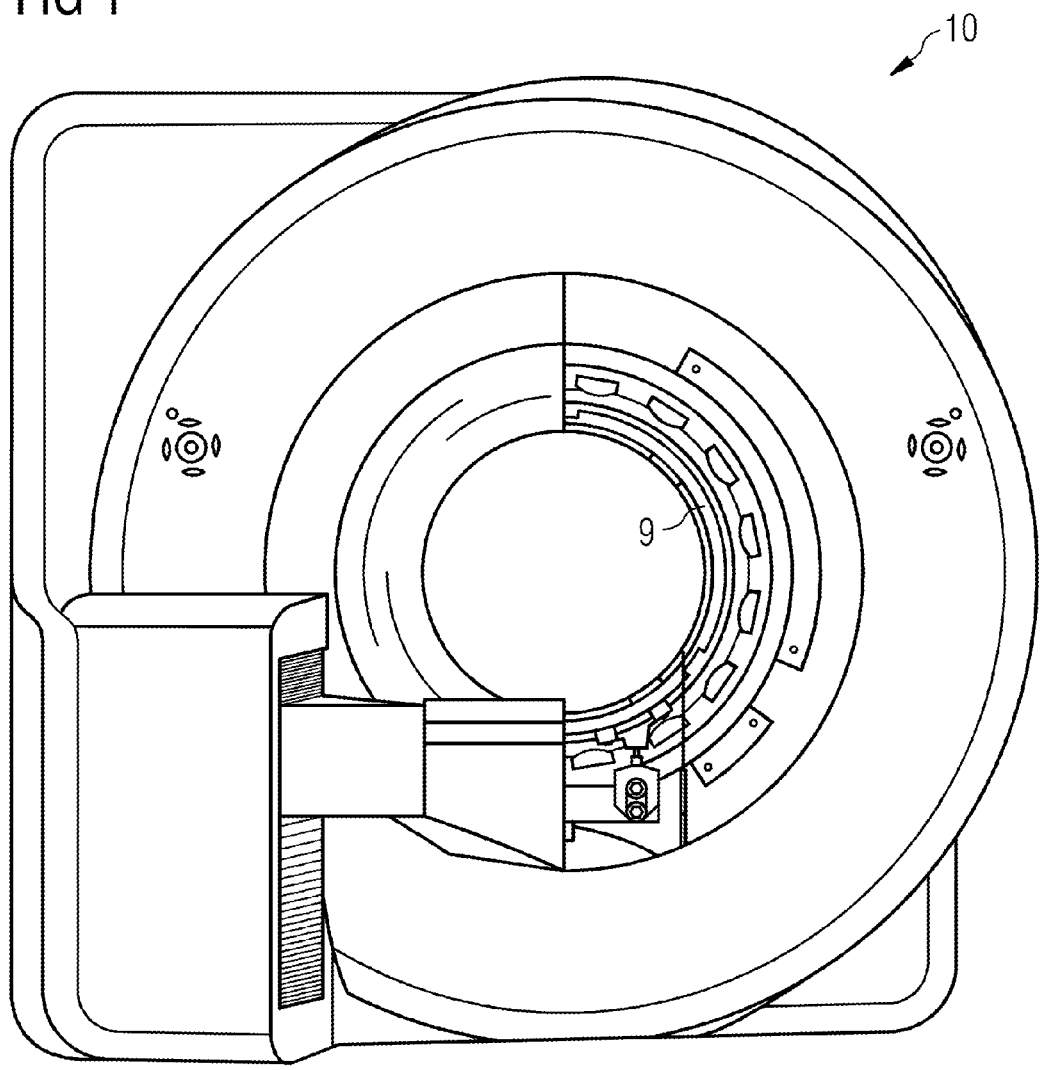
FIG. 1 shows a combined MR/PET system.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

A method for electromagnetic shielding of a device for a magnetic resonance system is provided within the scope of at least one embodiment of the present invention. In this situation the device is shielded with the aid of a conductive layer which surrounds an inner part of the device in such a manner that an electrical current path completely around the inner part can be formed in the layer. In other words a circular current can be generated by way of induction, which flows around the circumference of the inner part in the layer. In this situation the layer is arranged between a housing which surrounds the inner part (in particular completely) and the inner part.

A conductive layer is understood here in particular to be a metal layer, for example a copper layer. The layer surrounds the inner part in such a manner that a current path is able to form in the layer on account of the magnetic field to be shielded, which current path flows around the inner part in order to thus virtually circle the inner part. In this situation it is possible for the layer to completely surround the inner part. It is however also possible that the layer only partially surrounds the inner part. Since the layer is arranged between the housing and the inner part, the housing virtually surrounds the layer. In other words the layer lies outside the housing.

Since the layer is surrounded by the housing of the device for shielding purposes, the housing protects the shield or the layer such that a mounting facility by which the device (and thus the housing) is fastened on the magnetic resonance system is unable to cause any damage to the shield or to the layer because the shield or the layer is protected by the housing.

The method according to at least one embodiment of the invention for shielding can also be interpreted as a manufacturing method for manufacturing a device, wherein the device is manufactured with a conductive layer for electromagnetic shielding located inside the housing.

In this situation, an electrical insulation is advantageously arranged between the conductive layer and the inner part.

Since electrical currents are induced in the conductive layer by the magnetic field to be shielded, it is advantageous to electrically insulate from the layer the inner part in which in particular electrical circuits are situated.

A further method for electromagnetic shielding of a device for a magnetic resonance system is provided within the scope of at least one embodiment of the present invention. Also in the case of the further method the device is shielded with the aid of a conductive layer which surrounds the device in such a manner that an electrical current path completely around the device can be formed, as stated earlier. In this situation the device which is surrounded by the layer is mounted or fastened on the magnetic resonance system by way of a plurality of projections. Each of the projections has a contact surface with the layer, in which case the contact surface is defined by the fact that the respective projection contacts the layer at said contact surface. In other words, the device is fastened on the magnetic resonance system with the aid of one or more mounting facilities. In this situation the mounting facility or the mounting facilities has/have a plurality of projections, in which case the device to be mounted is contacted only by way of the projections (and not by other parts of the mounting facility).

Whereas the shielding layer according to the prior art is contacted by a mounting facility, by which the device is fastened on the magnetic resonance system, over almost the entire length of the device, according to at least one embodiment of the invention the shielding layer is contacted only at a plurality of projections, as a result of which the cracks forming due to the vibrations of the magnetic resonance system are restricted to the size of said contact surfaces.

The further method according to at least one embodiment of the invention can also be regarded as a method for fastening a device, onto which a conductive layer is applied externally for shielding purposes, on a magnetic resonance system. In this situation the fastening is implemented by the aforementioned projections.

The dimensions of the contact surfaces and thus the size of the cracks forming can be chosen dependent on a frequency at which a magnetic field of the magnetic resonance system changes (for example on switching the magnetic field gradients). Magnetic field noise, which occurs on switching the magnetic field gradients, exhibits frequencies in a range from 100 kHz up to several MHz. In order that the conductive layer having cracks also shields such magnetic field noise, the cracks should not be larger than 3 cm, which means that the projections are designed in such a manner that the resulting contact surface with the conductive layer exhibits the maximum 3 cm as a maximum length dimension. In other words, no length dimension which is greater than 3 cm exists with regard to a contact surface. If the contact surface is for example circular in shape, the diameter of the circle is accordingly a maximum of 3 cm, and if the contact surface is for example rectangular, the diagonal of said rectangle is a maximum 3 cm in length.

Whereas a crack which forms in the shield as a result of a mounting facility according to the prior art and extends over almost the entire device almost completely overrides the electromagnetic shielding implemented by the shield, a shield which has holes a maximum 3 cm in diameter is still almost completely effective for the frequencies described earlier.

In the case of an example embodiment according to the invention, the projections have a rounded or spherical shape which means that a circular contact surface having a small radius which can also be regarded as punctiform is formed.

With regard to at least one embodiment, as a result of the vibration of the magnetic resonance system, at most small holes (diameter significantly below 1 cm) are accordingly produced in the shield which means that the magnetic fields, even if said holes form, can still be effectively shielded.

The method according to at least one embodiment of the invention can be combined with the further method according to at least one embodiment of the invention. With regard to said combination, the inner part of the device in which the electrical circuit of the device is arranged is electromagnetically shielded on the one hand by a conductive layer situated outside the housing and on the other hand by a conductive layer situated inside the housing.

If the combination in which the electromagnetic shield is formed by two conductive layers is compared with one of the variants according to the invention in which the shield is formed only by one conductive layer (which is situated inside or outside the housing), then the sum of the thicknesses of the conductive layers of the combination can essentially correspond to the thickness of the conductive layer of one of the variants having only one conductive layer. In other words, each of the two layers in the combination can for example only be formed half as thick if the layer thickness is compared with the layer thickness of the variants in which the shield is implemented by only one conductive layer.

The layer thickness of the conductive layer(s) is advantageously chosen dependent on the magnetic field of the magnetic resonance system in such a manner that on the one hand the influence of the magnetic field, in particular when switching the magnetic field gradients, is heavily attenuated in respect of the electrical circuit arranged in the inner part of the device, but that on the other hand the magnetic field generated by the magnetic resonance system, in particular the magnetic field gradients, are as far as possible not attenuated by electrical currents which are induced in the layer or layers. In other words, the shield must be formed such (thinly) that the shield is almost transparent to the magnetic field gradient fields (i.e. for change frequencies in respect of the magnetic field of less than 100 kHz) which are generated by the magnetic resonance system for the purpose of MR imaging.

In today's magnetic resonance systems this requirement relating to the layer thickness of the conductive layer(s) is met when the layer thickness is less than 50 µm. In this case the currents induced in the shield are sufficiently large in order to shield the magnetic field but on account of the small dimension or small layer thickness are not so large that the eddy currents formed in the respective conductive layer have a negative effect on the properties of the magnetic field generated by the magnetic resonance system.

The device in question to be shielded may be a PET detector.

A PET detector has a length of approx. 30 cm in the z direction of the magnetic resonance system and dimensions in the range of up to 10 cm within a plane perpendicular to the z direction. It is therefore sufficient if the shield is approximately cylindrical in shape. In this situation it is sufficient if the shield encompasses the lateral surface of the cylinder. The base or top surfaces of the cylinder do not necessarily need to have a shield.

A device for a magnetic resonance system is also provided within the scope of at least one embodiment of the present invention. In this situation, the device comprises an inner part, a housing, and a conductive layer. For electromagnetic shielding the conductive layer is arranged around the inner part in such a manner that an electrical current path completely around the inner part can be formed in the layer. The housing surrounds the layer such that the layer is arranged between the inner part and the housing.

A further device for a magnetic resonance system is also provided within the scope of at least one embodiment of the present invention. The further device comprises a conductive layer and projections. The conductive layer surrounds the remainder of the device (i.e. the device without the layer and the projections) in such a manner that an electrical current path completely around the remainder of the device can be formed. The device is mounted on the magnetic resonance system with the aid of the projections. In this situation, each projection contacts the conductive layer at a contact surface.

The fundamental inventive idea relating to the further device can also be implemented in the form of a system which comprises a device (for example a PET detector (PET: "positron emission tomography")) having a conductive layer situated externally and one or more mounting facilities. The device is mounted on the magnetic resonance system with the aid of the mounting facility (facilities). The mounting facility (facilities) has/have a plurality of projections which in each case contact the conductive layer at a contact surface for mounting the device.

Both the device according to at least one embodiment of the invention and also the further device according to at least one embodiment of the invention can be a PET detector.

A magnetic resonance system which comprises a device according to at least one embodiment of the invention or a further device according to at least one embodiment of the invention is also provided within the scope of at least one embodiment of the present invention.

At least one embodiment of the present invention is suitable in particular for use for a combined MR/PET system. At least one embodiment of the present invention is naturally not restricted to this preferred field of application because at least one embodiment of the present invention can for example also be used for shielding an electrical circuit for a magnetic resonance system not having a PET detector. Furthermore, at least one embodiment of the present invention can also be used for shielding magnetic fields which are not generated by a magnetic resonance system.

FIG. 1 shows a combined MR/PET system 10, wherein PET detectors (not shown in FIG. 1) are arranged inside the magnetic resonance system 10 in a so-called carrier tube 9.

Figure 2:
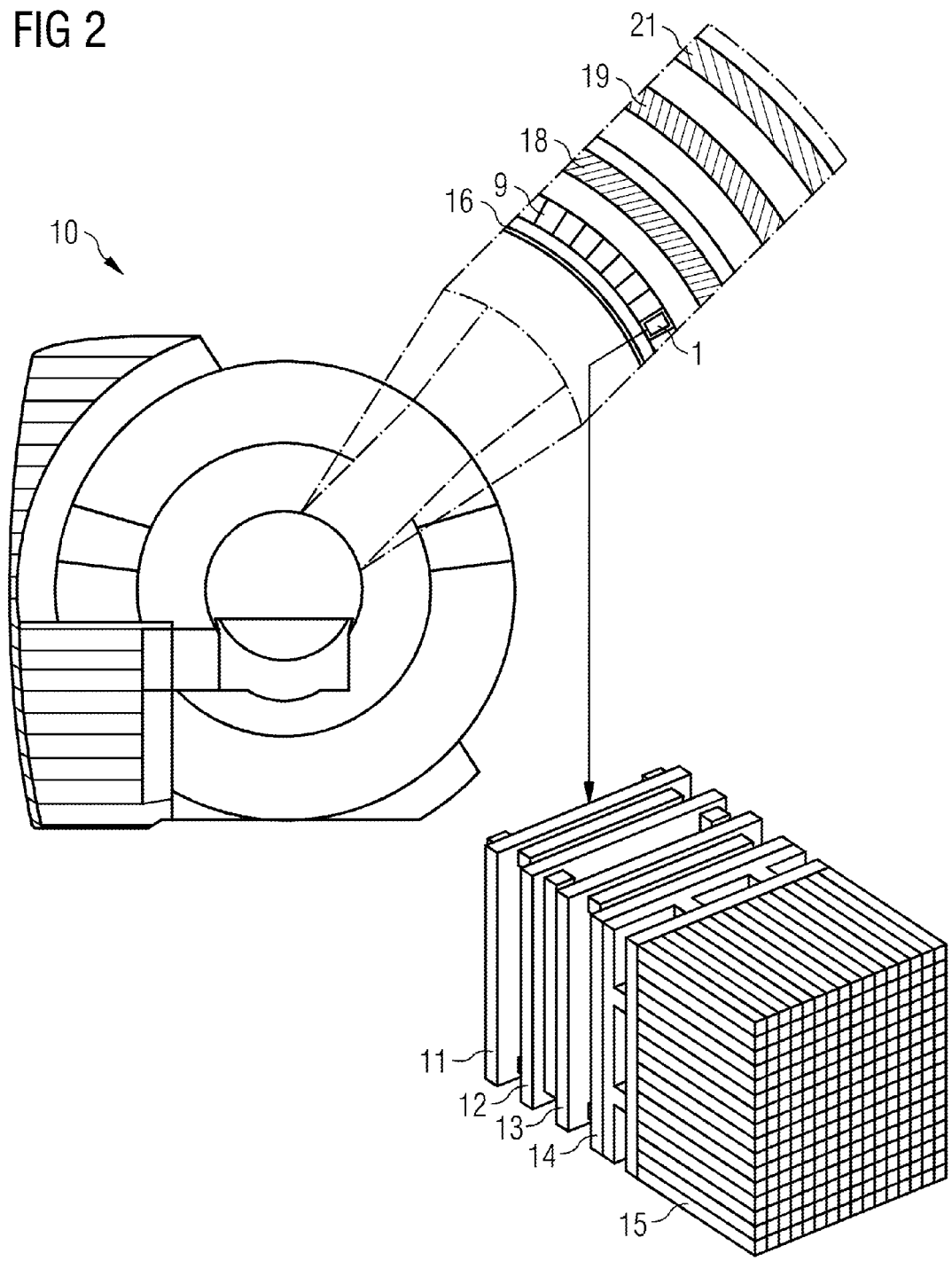
FIG. 2 shows a schematic section of a combined MR/PET system.

FIG. 2 shows the structure of such a combined MR/PET system 10 in more detail. The carrier tube 9, in which for example 56 PET detectors 1 are arranged around the circumference of a circle, is situated outside the body coil 16 of the magnetic resonance system 10. The carrier tube 9 is surrounded in this sequence by the winding for gradient fields 18, by the winding for the primary magnetic field 19 and by the winding for shielding the magnetic field 21.

The individual PET detector 1, which is shown here without shielding according to an embodiment of the invention, comprises a driver circuit board 11, a preamplifier circuit board 12, a high-voltage circuit board 13, avalanche photodiodes 14 and LSO crystals 15 (lutetium oxyorthosilicate) as the detector material.

Figure 3:
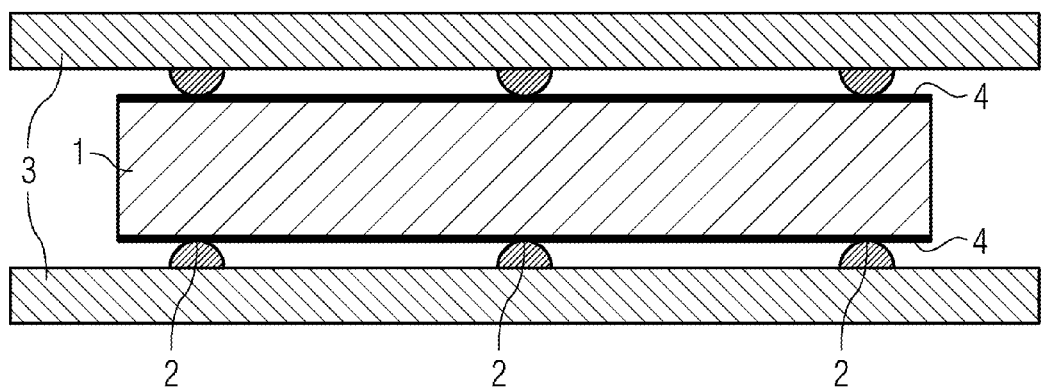
FIG. 3 shows the mounting facility according to an embodiment of the invention of a PET detector.

FIG. 3 shows how an individual PET detector 1 is mounted according to an embodiment of the invention in a recess 3 inside the carrier tube 9 (see FIG. 1 or 2). It can be seen that the mounting facility implemented through the recess 3 contacts the PET detector 1 only through projections 2 of the mounting facility. This means that contact surfaces exist at which the projections 2 contact the PET detector 1 and which correspond to a circular area having a diameter of a few millimeters. Even if the projections 2 contact the PET detector 1 at the latter's shield or thin conductive layer 4, for the case where holes are produced in the shield 4 in the case of the contact surfaces due to vibrations of the magnetic resonance system 10, said holes have such small dimensions that the effectiveness of the shield 4 is almost not affected.

Figure 4:
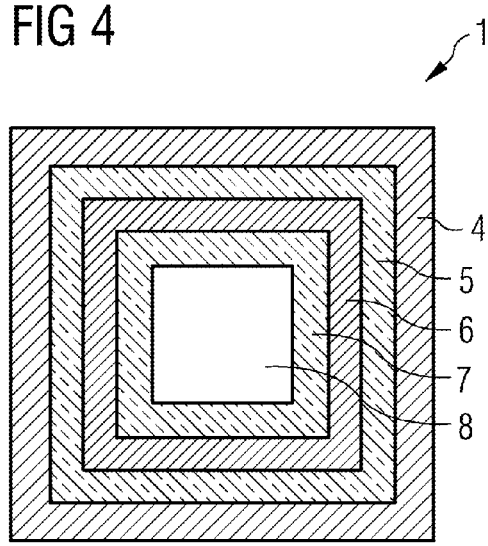
FIG. 4 shows a PET detector according to an embodiment of the invention having two shielding layers.

FIG. 4 shows a PET detector 1 according to the invention which has two shields 4, 6. The inner part 8 of the PET detector 1, which contains the electrical circuit 11-15 (see FIG. 2), is surrounded by an insulating layer 7. Said insulating layer 7 surrounds an inner copper layer 6 which constitutes the first shield against electromagnetic waves. The insulating layer 7 prevents currents generated as a result of induction in the inner copper layer 6 from flowing into the electrical circuit 11-15 of the inner part 8. The inner copper layer 6 is surrounded by a housing 5 of the PET detector 1, onto which is applied an outer copper layer 4 for the purpose of further electromagnetic shielding.

It should be noted that in particular the illustration of the inner and outer copper layer 4, 6 is not to scale because the thickness of said copper layers 4, 6 lies in a range from 30 to 50 μm.

The invention claimed is:

1. A method for electromagnetic shielding of a device for a magnetic resonance system, comprising:
   shielding the device using a conductive layer, which is attached to a carrier tube recess only by tangential contact with a surface of at least one semi-circular projection and which surrounds an inner part of the device in such a manner that an electrical current path completely around the inner part is formable in the conductive layer, the conductive layer being arranged between a housing of the device, which surrounds the inner part, and the inner part.

2. The method of claim 1, wherein an electrical insulation is arranged between the conductive layer and the inner part.

3. The method of claim 2, wherein a thickness of the conductive layer is chosen dependent on a magnetic field of the magnetic resonance system in such a manner that an influence of the magnetic field in respect of a switching of magnetic field gradients of the magnetic resonance system is heavily attenuated, but the magnetic field gradients are almost not attenuated by electrical currents which are induced in the layer.

4. The method of claim 2, wherein the conductive layer has a thickness of less than 50 μm.

5. The method of claim 2, the conductive layer is formed from copper.

6. The method of claim 1, wherein a thickness of the conductive layer is chosen dependent on a magnetic field of the magnetic resonance system in such a manner that an influence of the magnetic field in respect of a switching of magnetic field gradients of the magnetic resonance system is heavily attenuated, but the magnetic field gradients are almost not attenuated by electrical currents which are induced in the layer.

7. The method of claim 1, wherein the conductive layer has a thickness of less than 50 μm.

8. The method of claim 1, the conductive layer is formed from copper.

9. A method for electromagnetic shielding of a device for a magnetic resonance system, comprising:
   shielding the device using a conductive layer which surrounds the device in such a manner that an electrical current path completely around the device is formable, the device with the conductive layer being mounted on a carrier tube recess of the magnetic resonance system only by tangential contact with semi-circular projections, and each of the projections including a tangential contact surface with the conductive layer, at which each respective projection contacts the conductive layer.

10. The method of claim 9, wherein the maximum length dimension of the contact surface is shorter than 3 cm.

11. The method of claim 9, wherein the contact surface is circular in shape.

12. The method of claim 9, further comprising:
   shielding the device using another conductive layer which surrounds an inner part of the device in such a manner that an electrical current path completely around the inner part is formable in the another conductive layer, the another conductive layer being arranged between a housing of the device, which surrounds the inner part, and the inner part.

13. The method of claim 12, wherein a sum of a thicknesses of the conductive layer and the another conductive layer, in comparison with an operational situation in which the device were to be shielded only with one of the two conductive layers, essentially corresponds to the thickness of the one conductive layer.

14. A device for a magnetic resonance system, comprising:
   an inner part;
   a housing surrounding the inner part; and
   a conductive layer, for electromagnetic shielding from the magnetic resonance system, surrounding the inner part in such a manner that an electrical current path completely around the inner part is formable in the conductive layer, the conductive layer being attached to a carrier tube recess only by tangential contact with a surface of a semi-circular projection and being arranged between the inner part and the housing.

15. The device of claim 14, further comprising a PET detector.

16. The device of claim 14, further comprising:
   a magnetic resonance system around the device.

17. A device for a magnetic resonance system, comprising:
   a conductive layer; and
   semi-circular projections surrounding a remainder of the device to mount the conductive layer of the device on a carrier tube recess of the magnetic resonance system, wherein for electromagnetic shielding from the magnetic resonance system, the conductive layer surrounds the remainder of the device in such a manner that an electrical current path completely around the device is formable in the conductive layer, the device being mounted on the magnetic resonance system only via tangential contact with a surface of the projections, each of the projections including a contact surface with the conductive layer at which each of the respective projections contacts the conductive layer.

18. The device of claim 17, further comprising a PET detector.

19. The device of claim 17, further comprising a magnetic resonance system around the device.

* * * * *